United States Patent
Kang et al.

(10) Patent No.: US 8,271,856 B2
(45) Date of Patent: Sep. 18, 2012

(54) RESISTIVE MEMORY DEVICES AND METHODS OF CONTROLLING OPERATIONS OF THE SAME

(75) Inventors: Sang-Beom Kang, Gyeonggi-do (KR); Chul-Woo Park, Gyeonggi-do (KR); Hyun-Ho Choi, Gyeonggi-do (KR); Ho-Jung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 12/711,416

(22) Filed: Feb. 24, 2010

(65) Prior Publication Data
US 2010/0218073 A1   Aug. 26, 2010

(30) Foreign Application Priority Data
Feb. 25, 2009  (KR) .................... 10-2009-0015575

(51) Int. Cl.
*G11C 29/00*   (2006.01)
(52) U.S. Cl. ........ 714/764; 714/746; 714/763; 714/766; 714/800; 714/802; 714/6.24; 714/52; 365/185.03; 365/185.18; 365/185.09; 365/185.33
(58) Field of Classification Search .................. None
See application file for complete search history.

(56) References Cited

U.S. PATENT DOCUMENTS

| | | | |
|---|---|---|---|
| 7,450,425 B2 * | 11/2008 | Aritome | 365/185.19 |
| 8,095,851 B2 * | 1/2012 | Diggs et al. | 714/763 |
| 8,122,322 B2 * | 2/2012 | Miller | 714/766 |
| 2005/0281113 A1 * | 12/2005 | Yada et al. | 365/222 |
| 2007/0171710 A1 * | 7/2007 | Mito et al. | 365/185.03 |
| 2007/0247918 A1 * | 10/2007 | Shinagawa et al. | 365/185.24 |
| 2008/0301530 A1 * | 12/2008 | Spanel et al. | 714/765 |
| 2008/0313493 A1 * | 12/2008 | Roohparvar et al. | 714/6 |
| 2009/0019340 A1 * | 1/2009 | Radke et al. | 714/763 |
| 2009/0089646 A1 * | 4/2009 | Hirose et al. | 714/766 |
| 2009/0310408 A1 * | 12/2009 | Lee et al. | 365/185.03 |
| 2010/0262889 A1 * | 10/2010 | Bains | 714/758 |
| 2012/0106249 A1 * | 5/2012 | Roohparvar et al. | 365/185.03 |

FOREIGN PATENT DOCUMENTS

| KR | 100280457 B1 | 11/2000 |
|---|---|---|
| KR | 1020060031625 A | 4/2006 |
| KR | 1020060130018 A | 12/2006 |

* cited by examiner

*Primary Examiner* — John Trimmings
(74) *Attorney, Agent, or Firm* — Myers Bigel Sibley & Sajovec, P.A.

(57) ABSTRACT

To control operations of a resistive memory device, an input-output operation of an error check and correction (ECC) code is separated from an input-output operation of data. A condition of the input-output operation of the ECC code is determined stricter than a condition of the input-output operation of the data. reliability of the input-output operation of the ECC code may be enhanced, thereby reducing errors due to defect memory cells, noise, etc.

18 Claims, 10 Drawing Sheets

RESISTIVE MEMORY DEVICES AND METHODS OF CONTROLLING OPERATIONS OF THE SAME

REFERENCE TO PRIORITY APPLICATION

This application claims priority to Korean Patent Application No. 2009-0015575, filed Feb. 25, 2009, the contents of which are hereby incorporated herein by reference.

FIELD OF THE INVENTION

This invention relates to memory devices and, more particularly, to resistive memory devices, memory systems including the resistive memory devices, and methods of controlling input and output operations in resistive memory devices.

BACKGROUND

Semiconductor memory devices for storing data may be classified into volatile memory devices and non-volatile memory devices. The volatile memory devices are typically configured to store data by charging or discharging capacitors in memory cells, and widely used as main memories of various apparatuses. The volatile memory devices such as Dynamic Random Access Memory (DRAM) and Static Random Access Memory (SRAM) retain stored data while power is supplied and lose the stored data when power is off.

The non-volatile memory devices such as flash memory devices may maintain stored data even though power is off, and widely used for storing program codes and/or data in computers, mobile devices, etc.

According to demands for high memory capacity, high operation speed and low power consumption of the memory devices, new memory devices of various types have been developed to realize high integration rate of DRAM, high speed of SRAM and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials are attracting attention as memory devices of next generation. Such materials have common characteristics that resistance thereof is variable depending on magnitude and/or direction of applied voltage and/or current, and that the resistance can be maintained (that is, non-volatility) even though the applied voltage and/or current is intercepted and thus refresh operation is not required.

Each memory cell of the resistive memory devices may be formed with one resistive element and one switching element so that data may be stored by controlling voltage and/or current of a bitline and a wordline to change resistance of the resistive element.

Since the semiconductor memory device cannot perform its own function if it includes a defective memory cell, detection and/or correction of defective memory cells is required to enhance yield of the semiconductor memory device.

As one solution, repairing methods may be adopted such that defective memory cells are replaced with redundancy memory cells through logical address mapping. Enhancement of yield is limited since the number of redundancy memory cells is restricted.

As another solution, error check and correction (ECC) function may be embodied in the semiconductor memory device. According to ECC function, data and related ECC code are written in a memory cell array. If errors occur in the ECC code while the data and the ECC code are written and/or read, ECC function itself may be in vain.

SUMMARY

Methods of operating nonvolatile integrated circuit memory devices according to embodiments of the invention include generating a first ECC code associated with first data. This ECC code may be utilized to detect and correct at least one error in the first data upon reading the first data from a nonvolatile memory device. These embodiments further include writing the first data into the memory device using data write operations. To inhibit the generation of errors during the writing/storing of the first ECC code, an operation is performed to write the first ECC code into the memory device using ECC write operations that are less susceptible to error generation. In particular, the ECC write operations are configured to be more stringent in maintaining a stored accuracy of the first ECC code in the memory device relative to a stored accuracy of the first data in the memory device.

According to still further embodiments of the invention, the nonvolatile integrated circuit memory devices may include variable-resistance nonvolatile memory cells. In these embodiments, the ECC write operations may be configured to provide a narrower resistance distribution of a first data value (e.g., 0 or 1) written into the memory device relative to a resistance distribution of the first data value written into the memory device in response to the data write operations. To achieve this narrower resistance distribution, the incremental step pulses associated with the ECC write operations may be smaller in magnitude relative to incremental step pulses associated with the data write operations. Moreover, a maximum voltage generated by the incremental step pulses associated with the ECC write operations may be set at a value that is greater than a maximum voltage generated by the incremental step pulses associated with the data write operations.

According to additional embodiments of the invention, operations may be performed to read the first data from the memory device using data read operations and also separately read the first ECC code from the memory device using ECC read operations that are different than the data read operations. In particular, the ECC read operations are configured to be more stringent in maintaining an accuracy of the first ECC code being read from the memory device relative to an accuracy of the first data being read from the memory device. The types of nonvolatile memory devices that may benefit from these embodiments of the invention include, but are not limited to, EEPROM memory devices, resistive memory devices, magnetic memory devices and phase-changeable memory devices.

According to still further embodiments of the invention, a nonvolatile integrated circuit memory device is configured to include an array of nonvolatile memory cells and a control circuit electrically coupled to the array of nonvolatile memory cells. The control circuit is configured to write first data into the memory device using data write operations. The control circuit is further configured to write a first ECC code associated with the first data into the memory device using ECC write operations. These ECC write operations are configured to be more stringent in maintaining a stored accuracy of the first ECC code in the memory device relative to a stored accuracy of the first data in the memory device. The control circuit may also be configured to read the first data from the memory device using data read operations and also read the first ECC code from the memory device using ECC read operations. These ECC read operations are configured to be more stringent in maintaining an accuracy of the first ECC code being read from the memory device relative to an accuracy of the first data being read from the memory device.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
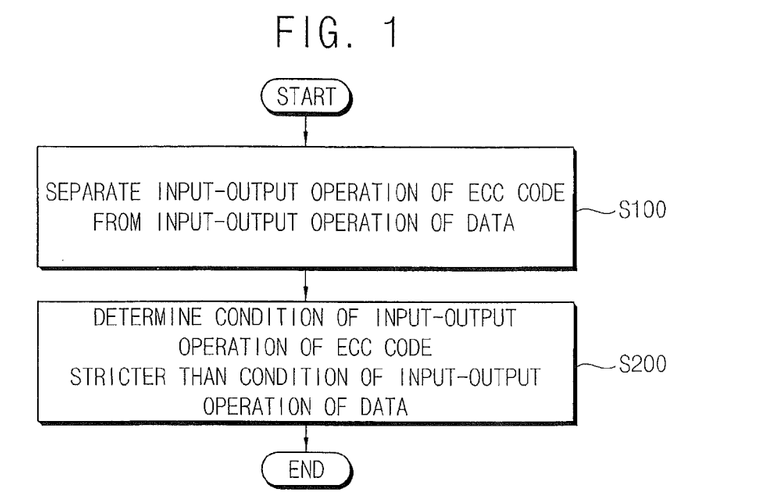
FIG. 1 is a flow chart illustrating a method of controlling operations of a resistive memory device according to example embodiments.

FIG. 1 is a flow chart illustrating a method of controlling operations of a resistive memory device according to example embodiments.

Referring to FIG. 1, in accordance with a method of controlling operations of a resistive memory device, an input-output operation of an error check and correction (ECC) code is separated from an input-output operation of data (step S100).

The resistive memory device requires a driver of high capacity for performing the input-output operation such as a write operation and a read operation on a page of about 4 KB memory cells, and probability of operation errors increases as an amount of simultaneously-input/output data increases. Accordingly, one page may be divided into two or more units to reduce the amount of simultaneously-input/output data. Particularly, when data and related ECC code are stored in the same page, the input-output operations of the ECC code and the data may be separated according to such division of each page.

Also the input-output operations of the ECC code and the data may be separated when the ECC code and the data are stored in different pages. For example, in case of a three-dimensional resistive memory device of multiple memory layers, the input-output operations of the ECC code and the data may be separated by designating memory layers for storing the ECC code and the other memory layers for storing the data.

The input-output operations of the ECC code and the data may be separated based on a mode signal or an address signal provided from an external device such as a memory controller. For example, first logic level (e.g., logic low level) of the mode signal may indicate the input-output operation of the data and second logic level (e.g., logic high level) of the mode signal may indicate the input-output operation of the ECC code.

When the input-output operations of the ECC code and the data are separated according to division of each page, the input-output operations of the ECC code and the data may be designated based on a column address. When the ECC code and the data are stored in different pages, the input-output operations of the ECC code and the data may be designated based on a row address.

The input-output operations of the ECC code and the data may be separated as the above-mentioned, and then conditions of the input-output operation are determined such that a condition of the input-output operation of the ECC code is stricter than a condition of the input-output operation of the data (Step S200). Applying stricter conditions to the input-output operation of the ECC indicates that reliability of input and/or output ECC code is enhanced more than reliability of input and/or output data. Example embodiments of determining the conditions of the input-output operations will be described later.

Separation of the input-output operations may include one or both of a write operation and a read operation. Also the conditions of the input-output operations may be determined with respect to one or both of the write operation and the read operation.

Figure 2:
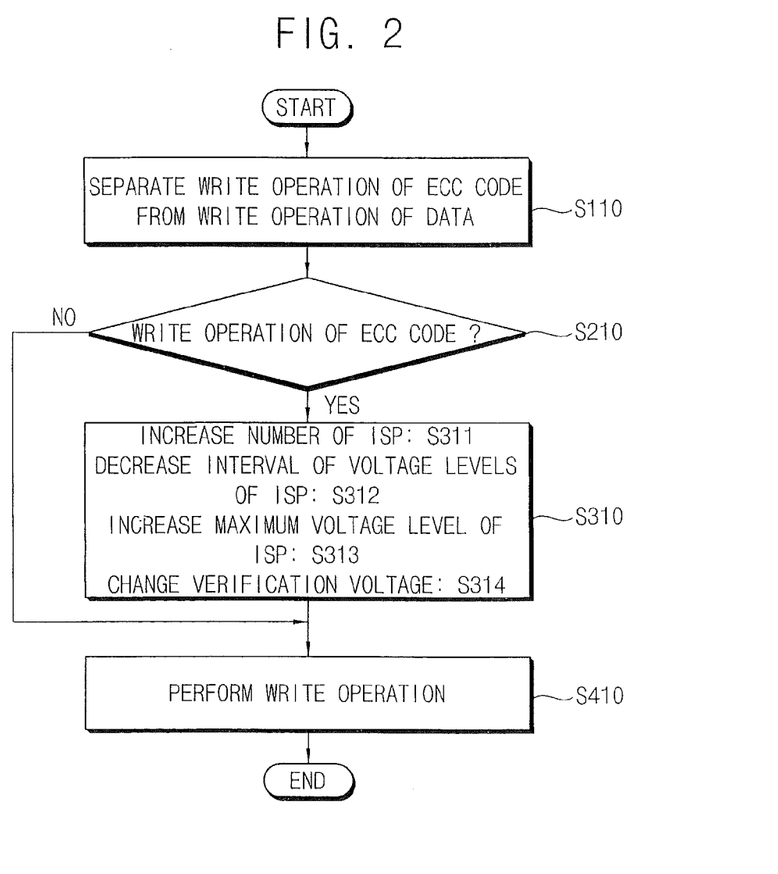
FIG. 2 is a flow chart illustrating a method of controlling a write operation in a resistive memory device according to example embodiments.

FIG. 2 is a flow chart illustrating a method of controlling a write operation in a resistive memory device according to example embodiments.

Referring to FIG. 2, a write operation of the ECC code is separated from a write operation of the data (Step S110). As mentioned above, such separation of the write operations may be performed based on a mode signal or an address signal provided from an external device such as a memory controller.

The resistive memory device may be operated based on default conditions, and values of the default conditions may be stored in mode set registers (MRS). For example, applying stricter conditions to the write operation of the ECC code than the write operation of the data may be performed by changing the default conditions.

When the data is written (Step S210: NO), the write operation of the data is performed (Step S410) based on default conditions of the input-output operation. When the ECC code is written (Step S210: YES), the default conditions are changed (Step S310) to apply stricter conditions to the input-output operation. In other words, a resistance distribution of code cells for storing the ECC code is reduced more narrowly than a resistance distribution of data cells for storing the data.

For example, the conditions of the write operation of the ECC code may become stricter by increasing the number of incremental step pulses (Step S311), by decreasing an interval of voltage levels of the incremental step pulses (Step S312), by increasing a maximum voltage level of the incremental step pulses (Step S313), and/or by changing a verification voltage (Step S314), compared with the default conditions of the write operation. Example embodiments of determining the conditions of the write operations will be further described later with descriptions of configurations of the resistive memory device.

Accordingly, the write operation of the ECC code is performed (Step S410) based on the changed conditions stricter than the write operation of the data.

Figure 3:
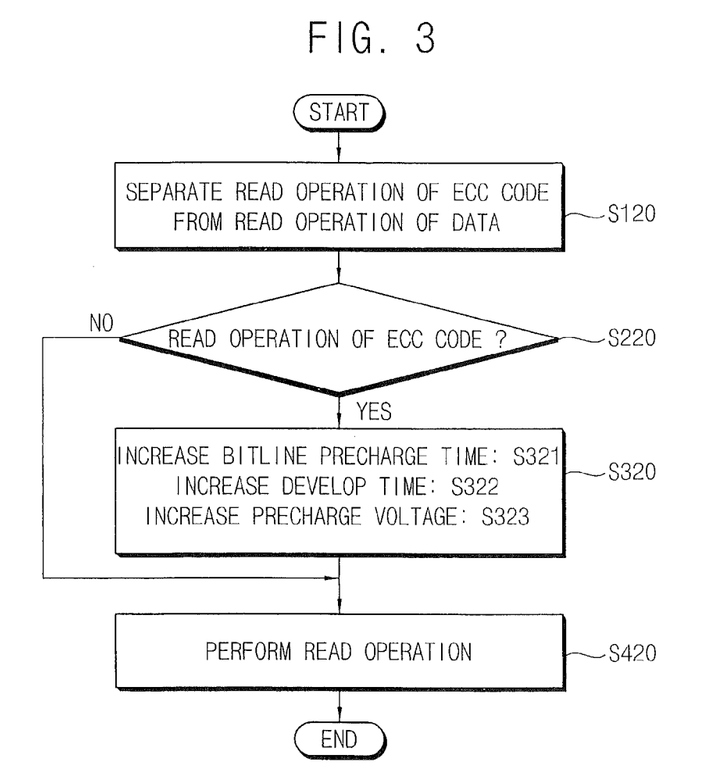
FIG. 3 is a flow chart illustrating a method of controlling a read operation in a resistive memory device according to example embodiments.

FIG. 3 is a flow chart illustrating a method of controlling a read operation in a resistive memory device according to example embodiments.

Referring to FIG. 3, a read operation of the ECC code is separated from a read operation of the data (Step S120). As mentioned above, such separation of the read operations may be performed based on a mode signal or an address signal provided from an external device such as a memory controller.

When the data is written (Step S220: NO), the read operation of the data is performed (Step S420) based on default conditions of the input-output operation. When the ECC code is written (Step S220: YES), the default conditions are changed (Step S320) to apply stricter conditions to the input-output operation.

For example, the conditions of the read operation of the ECC code may become stricter by increasing a bitline precharge time, by increasing a develop time, and/or by increasing a precharge voltage, compared with the default conditions of the read operation. Example embodiments of determining the conditions of the read operations will be further described later with descriptions of configurations of the resistive memory device.

Accordingly, the read operation of the ECC code is performed (Step S420) based on the changed conditions stricter than the read operation of the data.

Hereinafter, a resistive memory device and a memory system including the resistive memory device will be described. The above described method of controlling operations of a resistive memory device will be more clearly understood from the following detailed description of a resistive memory device and a memory system.

Figure 4:
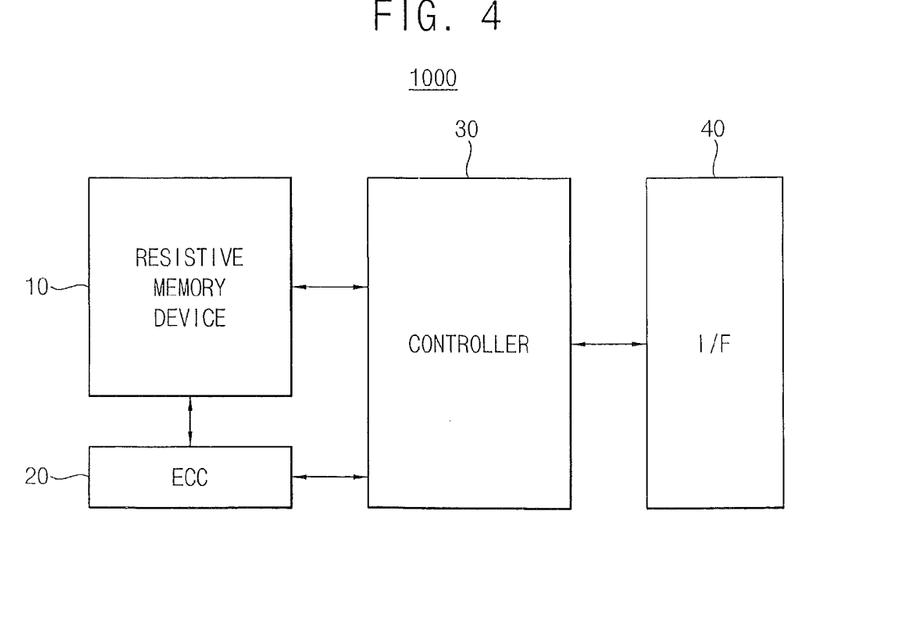
FIG. 4 is a block diagram illustrating a memory system according to example embodiments.

FIG. 4 is a block diagram illustrating a memory system according to example embodiments.

Referring to FIG. 4, a memory system 1000 includes a resistive memory device 10, an error check and correction (ECC) engine 20 and a controller 30. The memory system 1000 may further includes an interface (I/F) 40 for communication with an external device and/or a user.

The resistive memory device 10 includes a plurality of memory cells and the memory cells may be divided into code cells for storing an ECC code and data cells for storing data. The resistive memory device 10 determines a condition of an input-output operation of the ECC code stricter than a condition of an input-output operation of the data. The resistive memory device 10 will be further described with reference to FIGS. 5 through 16.

The ECC engine 20 generates a write ECC code based on write data to be input to the resistive memory device, and checks/corrects errors in read data based on a read ECC code output from the resistive memory device. The controller 30 controls the input-output operations of the resistive memory device 10 and operations of the ECC engine 20 such as code generation, error detection and error correction.

In memory systems adopting ECC function, memory cells in a memory cell array may be divided into code cells for storing an ECC code and data cells for storing data. During write operation, the ECC engine 20 generates the ECC code related with data to be written into the data cell, and stores the ECC code into the code cells. During read operation, the ECC engine 20 reads out the stored ECC code together with the stored data, and performs ECC operation based on the ECC code to detect and correct errors in the read data.

The ECC code may be one of well know codes such as a parity check code, a Hamming code, etc. For example, the parity check code is determined such that ECC calculation results in a constant value, in which the ECC calculation may be an exclusive-OR operation on each bit of the data and each bit of the parity check code. The result of the ECC code may be "1" in case of an odd parity type, or "0" in case of an even parity type. The ECC engine 20 detects error if the result of the read data and the read ECC code is different from a predetermined value, and corrects the error to output corrected data. The ECC engine 20 can more number of errors in the data as the bit number of the ECC code increases, but the bit number of the ECC code may be limited since cell overhead also increases according to the bit number of the ECC code.

Figure 5:
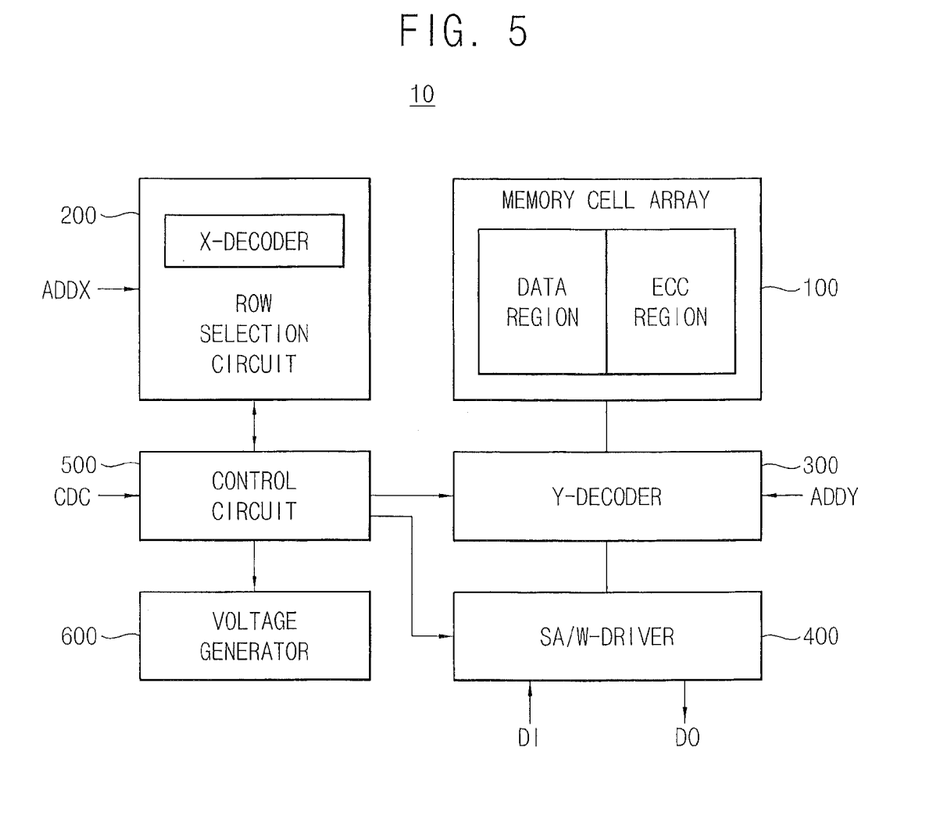
FIG. 5 is a block diagram illustrating a resistive memory device according to example embodiments.

FIG. 5 is a block diagram illustrating a resistive memory device according to example embodiments.

Referring to FIG. 5, a resistive memory device 10 includes a memory cell array 100, a control circuit 500 and a voltage generator 600. Also the resistive memory device 10 may further include a row selection circuit 200, a column decoder (Y-DECODER) 300, a sense amplifier and write driver (SA/W-DRIVER) 400. Even though elements required for describing inventive concept are illustrated in FIG. 5, the resistive memory device 10 may include an address buffer, a data buffer, a command buffer, a pre-decoder, and other peripheral circuits.

The memory cell array 100 includes a plurality of memory cells, and the memory cells may be divided into code cells in code region for storing an error check and correction (ECC) code and data cells in data region for storing data. Selection of memory cells performed by the row selection circuit 200 coupled to the memory cells through wordlines.

The row selection circuit 200 includes a row decoder (X-DECODER) configured to select a wordline based on an row address ADDX, and a wordline driver configured to apply corresponding voltages to the selected wordline and unselected wordlines. The data and the ECC code are written into and read out from the memory cells under control of the column decoder 300 and the sense amplifier and write driver 400, which are coupled to the memory cells through bitlines.

The control circuit 500 generates control signals, in response to a mode signal CDC, for determining a condition of an input-output operation of the ECC code that is stricter than a condition of an input-output operation of the data. As mentioned above, the mode signal CDC may be provided from an external device such as the controller 30 of FIG. 4, or may be generated in the control circuit 500 based on the address signals ADDX and ADDY.

The control signals generated by the control circuit 500 may include timing control signals and voltage control signals. The timing control signals may include a write enable signal WEN, a read enable signal REN, a sense enable signal SEN, a discharge signal DIS, a precharge signal PRE, etc. The control circuit 500 controls activation timing and/or activation duration of the timing control signals according to the input-output operation of the data or the input-output operation of the ECC code. The timing control signals are provided to row selection circuit 200, the column decoder 300 and the sense amplifier and write driver 400.

The voltage control signals may include signals for designating the number of incremental step pulses (ISP), the interval of voltage levels of the ISP, the maximum voltage level of the ISP, and levels of a bias voltage VB, a precharge voltage VPRE, a reference voltage VREF, etc. The control circuit 500 adjusts the voltage control signal according to the input-output operation of the data or the input-output operation of the ECC code. The voltage generator 600 generates the voltages for the input-output operation of the data and the ECC code in response to the voltage control signal from the control circuit 500.

Figure 6:
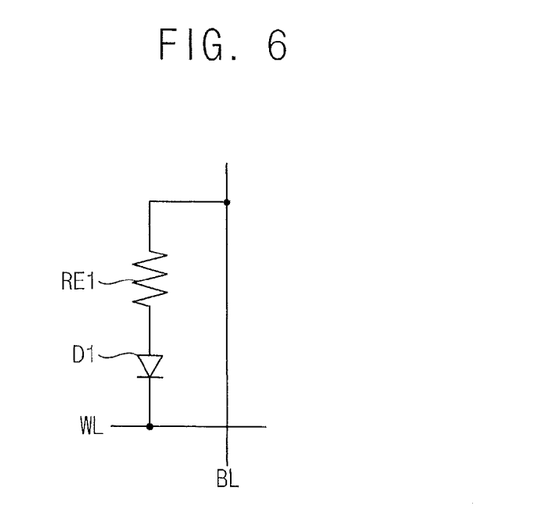
FIG. 6 is a diagram illustrating an example of a resistive memory cell of the memory cell array in FIG. 5.

FIG. 6 is a diagram illustrating an example of a resistive memory cell of the memory cell array in FIG. 5.

Referring to FIG. 6, a memory cell may include a resistive element RE1 and a diode D1 serially coupled between a bitline BL and a wordline WL. The memory cell of FIG. 6 may determine a resistance distribution of the resistive element RE1 by controlling voltages applied to the bitline BL and the wordline WL. The configuration of the memory cell of FIG. 6 may be adopted when the resistive element RE1 is a unipolar type. The write operation may be performed by applying the voltages to the bitline BL and the wordline WL, thereby controlling a voltage difference between both ends of the resistive element RE1 or controlling a current flowing through the resistive element RE1.

Figure 7:
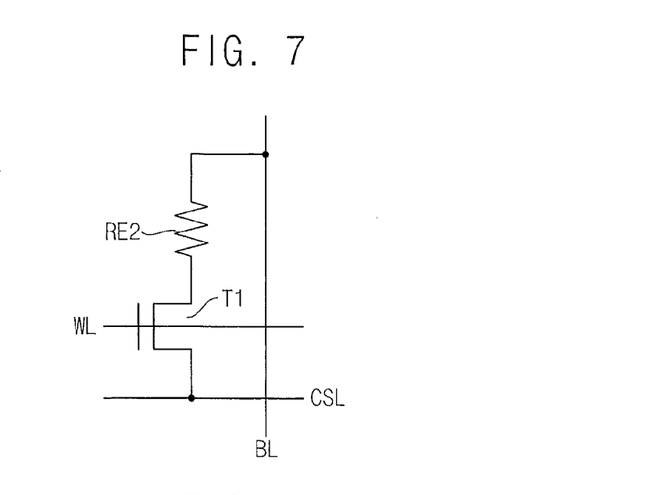
FIG. 7 is a diagram illustrating another example of a resistive memory cell of the memory cell array in FIG. 5.

FIG. 7 is a diagram illustrating another example of a resistive memory cell of the memory cell array in FIG. 5.

Referring to FIG. 7, a memory cell may include a resistive element RE2 and a switching element such as a transistor T1 serially coupled between a bitline BL and a common source line CSL. A gate of the transistor T1 is coupled to a wordline WL. The memory cell of FIG. 7 may determine a resistance distribution of the resistive element RE2 by controlling voltages applied to the bitline BL and the common source line CSL. The configuration of the memory cell of FIG. 7 may be adopted when the resistive element RE2 is a bipolar type as well as a unipolar type.

When the resistive element RE2 is a unipolar type, a resistance of the resistive element RE2 is controlled by magnitude of applied voltage. When the resistive element RE2 is a bipolar type, the resistance of the resistive element RE2 may be controlled by direction (i.e. polarity) of the applied voltage as well as magnitude of the applied voltage. The write operation may be performed by applying the voltages to the bitline BL and the common source line CSL, thereby controlling a voltage difference between both ends of the resistive element RE2 or controlling a current flowing through the resistive element RE2.

Figure 8:
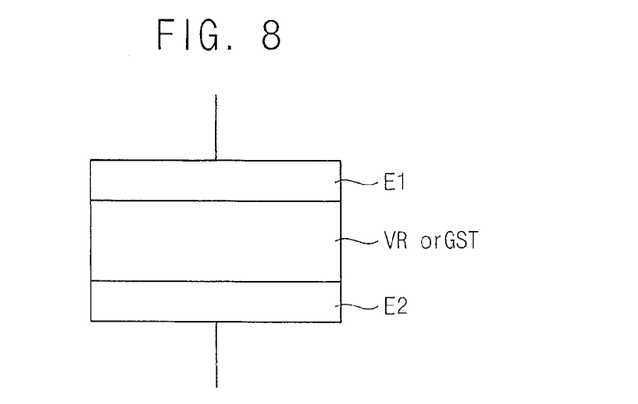
FIG. 8 is a diagram illustrating a unipolar resistive element in the resistive memory cell of FIGS. 6 and 7.

FIG. 8 is a diagram illustrating a unipolar resistive element in the resistive memory cell of FIGS. 6 and 7.

Referring to FIG. 8, the resistive element RE1 of FIG. 6 or the resistive element RE2 of FIG. 7 may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be totally referred to as resistive memories. Method and devices according to example embodiments may be applied to various resistive memories including PRAM, RRAM and MRAM.

The resistive material between the electrodes E1 and E2 is required to have a plurality of stable states having different resistance, and various resistive materials are being studied.

For example, while increasing a voltage applied to material having characteristic of Negative Differential Resistance (NDR), resistance of the NDR material abruptly increases at a reset voltage (Vreset), the relatively high resistance is maintained afterwards, and then the NDR material transitions to a state of relatively low resistance at a set voltage (Vset). In this case, the set voltage (Vset) for decreasing the resistance of the NDR material is greater than the reset voltage (Vreset) for decreasing the resistance of the NDR material.

Chalcogenide using telluride compound such as GeSbTe has relatively high resistance when relatively low voltage is applied, and transitions to a state of relatively low resistance if a sufficiently high voltage is applied. In this case, the set voltage (Vset) for decreasing the resistance of the Chalcogenide is smaller than the reset voltage (Vreset) for decreasing the resistance of the Chalcogenide.

As such, an ON-state of relatively low resistance and an OFF-state of relatively high resistance may be programmed or written into memory cells by applying the set voltage (Vset) and the reset voltage (Vreset) corresponding to characteristics of various materials included in the memory cells.

Figure 9:
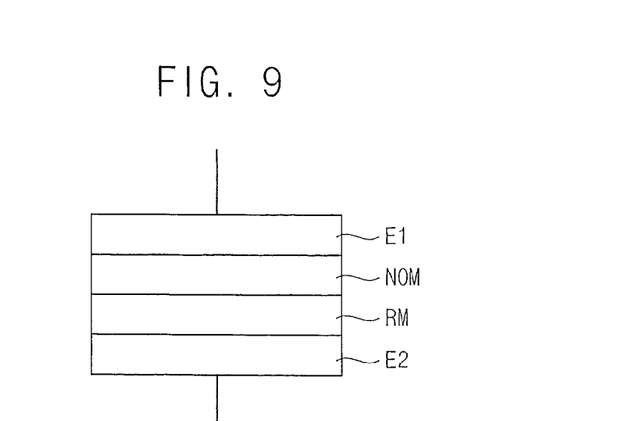
FIG. 9 is a diagram illustrating a bipolar resistive element in the resistive memory cell of FIG. 7.

FIG. 9 is a diagram illustrating a bipolar resistive element in the resistive memory cell of FIG. 7.

Referring to FIG. 9, the resistive element RE2 of FIG. 7 may include a first electrode E1, a second electrode E2, non-ohmic material (NOM) and resistive material (RM) between the electrodes E1 and E2. In this case, the ON-state and the OFF-state may be programmed or written into memory cells by applying opposite voltages to the electrodes E1 and E2. In other words, the ON-state and the OFF-state may be determined according to polarity of the applied voltage.

Figure 10:
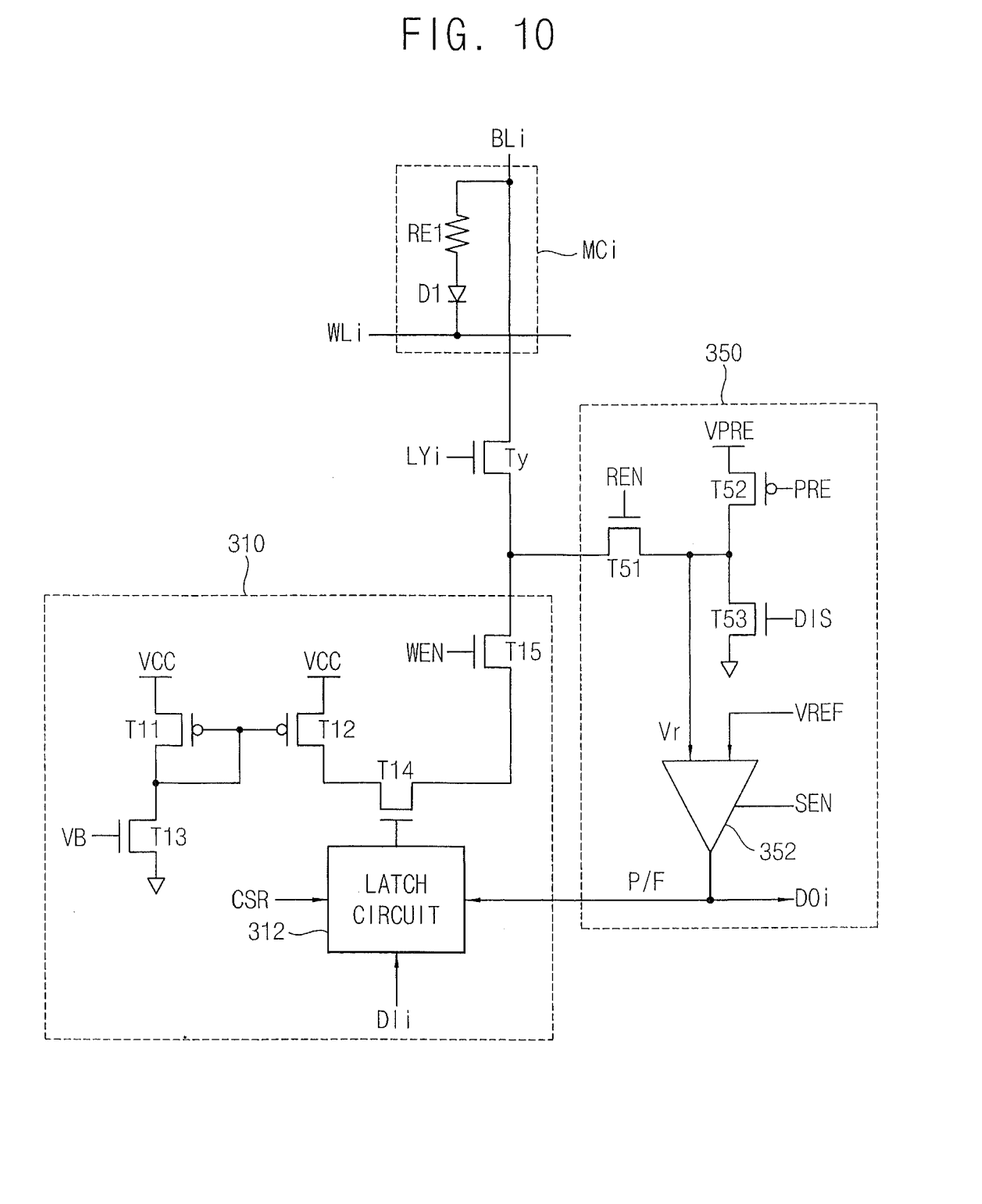
FIG. 10 is a circuit diagram illustrating an example of the sense amplifier and write driver in the resistive memory device of FIG. 5.

FIG. 10 is a circuit diagram illustrating an example of the sense amplifier and write driver in the resistive memory device of FIG. 5.

For convenience of description, only one memory cell MCi of a plurality of memory cells in a memory cell array is illustrated in FIG. 10. The memory cell MCi is coupled between a wordline WLi selected based on a row address ADDX and a bitline BLi selected by a transistor Ty in response to a bit LYi of a column address ADDY. The memory cell MCi has a configuration as described with reference to FIG. 6. Also FIG. 10 illustrates a write driver 310 for writing data or ECC code into the memory cell MCi, and a sense amplifier 350 for reading the stored data or ECC code from the memory cell MCi. The configuration of FIG. 10 may be applied to a resistive memory cell of a unipolar type.

The writ driver 310 may include first through fifth transistors T11 through T15 and a latch circuit 312. When a write enable signal WEN is activated to logic high level, the fifth transistor T15 is turned on to electrically couple the write driver 310 and the bitline BLi. The first transistor T11 and the second transistor T12 constitute a current mirror, and the current mirror provides a set voltage (Vset) or a reset voltage (Vreset) in response to a bias voltage VB applied to a gate of the third voltage.

The latch circuit 312 provide a voltage corresponding to an input bit DIi to a gate of the fourth transistor T14 in response to a write control signal CSR, and thus the fourth transistor T14 is turned on or off according to the input bit DIi. For example, when the write control signal CSR indicates a set-write operation for programming an ON-state of relatively low resistance, the bias voltage VB may have a corresponding level for providing the set voltage (Vset) and the fourth transistor T14 may be turned on if the input bit DIi is "1". In contrast, when the write control signal CSR indicates a reset-write operation for programming an OFF-state of relatively high resistance, the bias voltage VB may have a corresponding level for providing the reset voltage (Vset) and the fourth transistor T14 may be turned on if the input bit DIi is "0".

The sense amplifier 350 may include first, second and third transistors T51, T52 and T53, and a comparator 352. When a read enable signal REN is activated to logic high level, the first transistor T51 is turned on to electrically coupling the sense amplifier 350 and the bitline BLi. When a discharge signal DIS is activated to logic high level, the third transistor T53 is turned on to initialize the bitline BLi to a ground voltage.

When a precharge signal PRE is activated to logic low level, the second transistor T52 is turned on to charge the bitline BLi with a precharge voltage VPRE. The comparator 352 compares a sensed voltage Vr with a reference voltage VREF to generate an output bit DOi indicating whether the memory cell MCi is in the ON-state or the OFF-state. The output bit DOi may be provided to an external device during a read operation, or may be provided as a pass/fail signal P/F to the latch circuit 412 during a verification operation for verifying whether programming of a desired state is completed. The latch circuit 312 may turn off the fourth transistor T14 regardless of the value of the input bit DIi when the pass/fail signal P/F indicates that programming of the memory cell MCi is completed.

Figure 11:
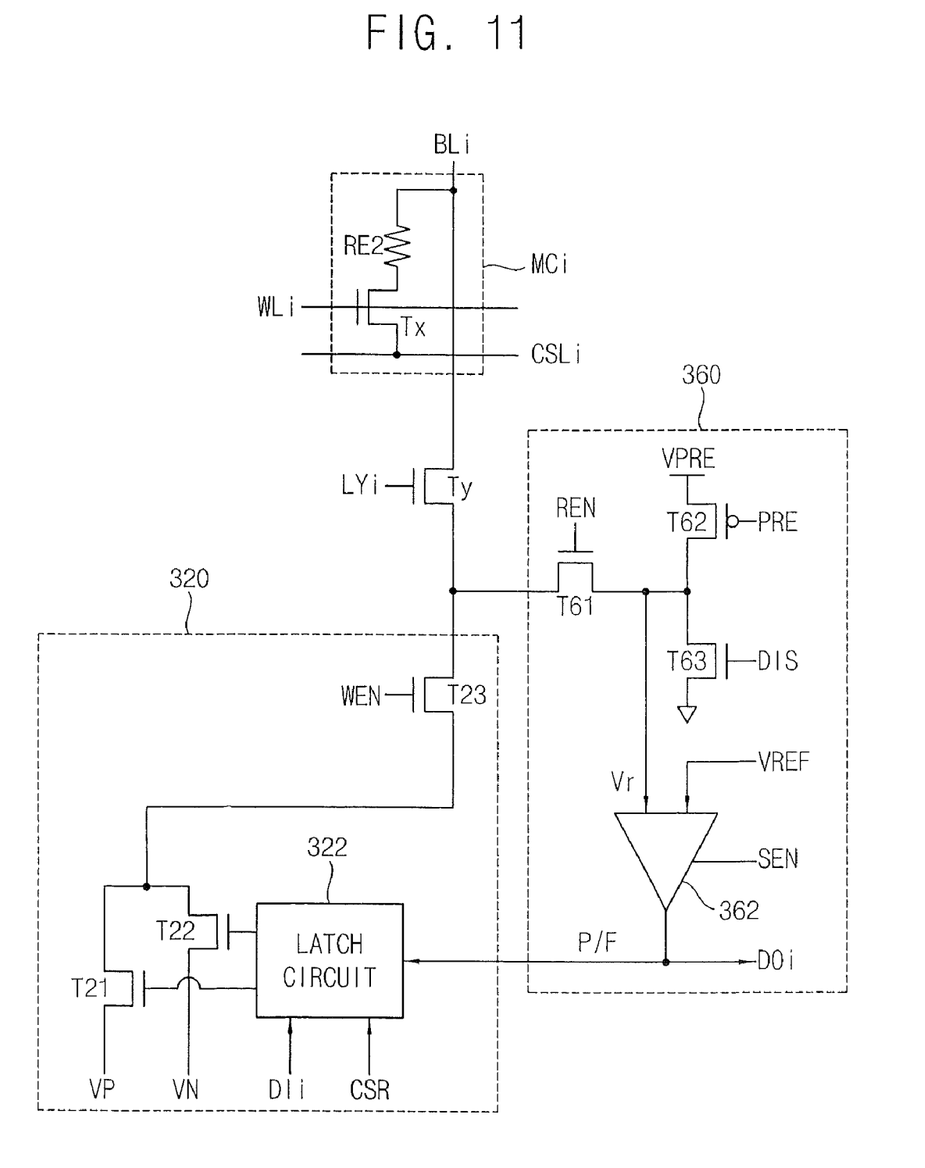
FIG. 11 is a circuit diagram illustrating another example of the sense amplifier and write driver in the resistive memory device of FIG. 5.

FIG. 11 is a circuit diagram illustrating another example of the sense amplifier and write driver in the resistive memory device of FIG. 5.

For convenience of description, only one memory cell MCi of a plurality of memory cells in a memory cell array is illustrated in FIG. 11. The memory cell MCi is coupled to a wordline WLi selected based on a row address ADDX and coupled between a common source line CSLi and a bitline BLi selected by a transistor Ty in response to a bit LYi of a column address ADDY. The memory cell MCi has a configuration as described with reference to FIG. 7. Also FIG. 11 illustrates a write driver 320 for writing data or ECC code into the memory cell MCi, and a sense amplifier 360 for reading the stored data or ECC code from the memory cell MCi. The configuration of FIG. 11 may be applied to a resistive memory cell of a bipolar type.

The writ driver 320 may include first, second and third transistors T21, T22 T23 and a latch circuit 322. When a write enable signal WEN is activated to logic high level, the third transistor T23 is turned on to electrically couple the write driver 320 and the bitline BLi. The first transistor T21 switches a positive set voltage VP for writing an ON-state of relatively low resistance, and the second transistor T22 switches a negative reset voltage VN for writing an OFF-state of relatively high resistance The latch circuit 322 provide two voltages corresponding to an input bit DIi in response to a write control signal CSR to gates of the first and second transistors T21 and T22, and thus one of the first and second transistors T21 and T22 may be selectively turned on according to the input bit DIi. For example, when the write control signal CSR indicates a set-write operation for programming the ON-state of relatively low resistance, the first transistor T21 is turned on to provide the positive set voltage VP to the bitline BLi and the second transistor T22 is turned off. In contrast, when the write control signal CSR indicates a reset-write operation for programming the OFF-state of relatively high resistance, the second transistor T22 is turned on to provide the negative set voltage VN to the bitline BLi and the first transistor T21 is turned off.

The sense amplifier 360 may include first, second and third transistors T61, T62 and T63, and a comparator 362. As described with reference to FIG. 10, when a read enable signal REN is activated to logic high level, the first transistor T61 is turned on to electrically coupling the sense amplifier 360 and the bitline BLi. When a discharge signal DIS is activated to logic high level, the third transistor T63 is turned on to initialize the bitline BLi to a ground voltage.

When a precharge signal PRE is activated to logic low level, the second transistor T62 is turned on to charge the bitline BLi with a precharge voltage VPRE. The comparator 362 compares a sensed voltage Vr with a reference voltage VREF to generate an output bit DOi indicating whether the memory cell MCi is in the ON-state or the OFF-state. The output bit DOi may be provided to an external device during a read operation, or may be provided as a pass/fail signal P/F to the latch circuit 422 during a verification operation for verifying whether programming of a desired state is completed. The latch circuit 322 may turn off both of the first and second transistors T21 and T22 regardless of the value of the input bit DIi when the pass/fail signal P/F indicates that programming of the memory cell MCi is completed.

Figure 12:
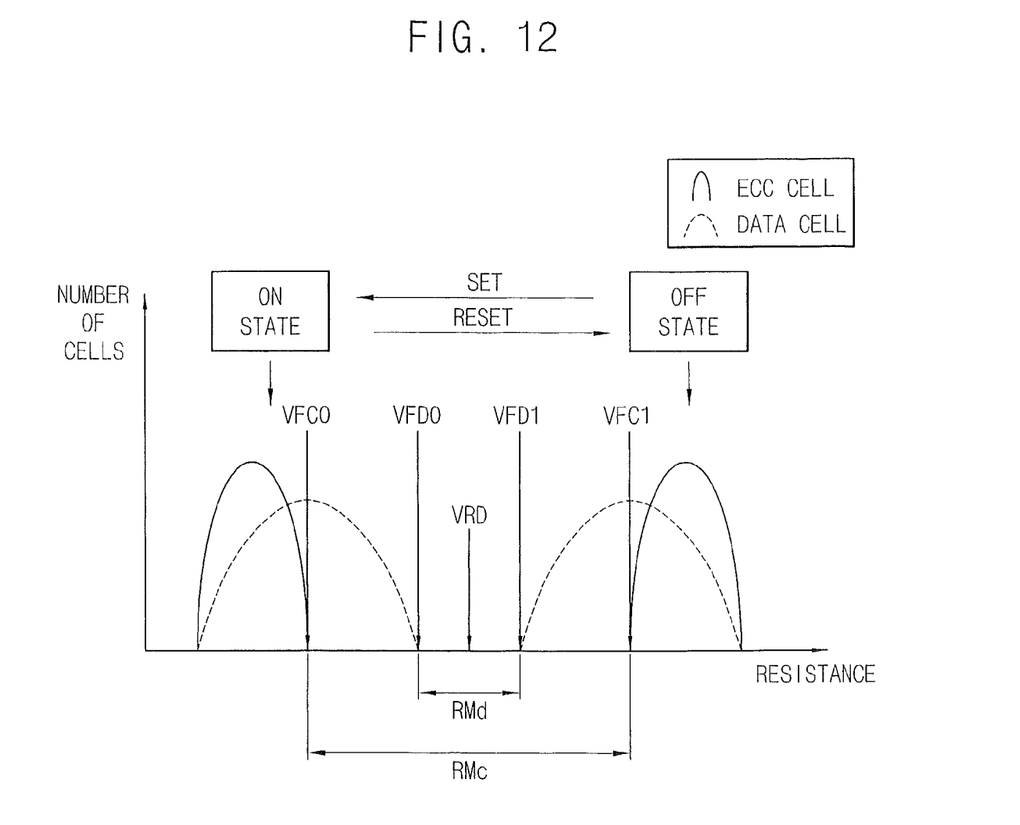
FIG. 12 is a diagram illustrating resistance distribution of memory cells in a resistive memory device according to example embodiments.

FIG. 12 is a diagram illustrating resistance distribution of memory cells in a resistive memory device according to example embodiments.

Referring to FIG. 12, a condition of the input-output operation of the ECC code may be determined stricter than a condition of the input-output operation of the data, such that a resistance distribution (solid line) of code cells for storing the ECC code becomes more narrowly than a resistance distribution (dotted line) of data cells for storing the data.

A write operation for programming states of the memory cell may include a set-write operation for programming an ON-state of relatively low resistance distribution and a reset-write operation for programming an OFF-state of relatively high resistance distribution. Such different distributions between code memory cells for storing the ECC code and data memory cells for storing the data may be embodied by determining the set voltage and the reset voltage for the write operation of the ECC code stricter than for the write operation of the. Also such different distributions may be embodied by determining verification voltages VFC0 and VFC1 for the write operation of the ECC code stricter than verification voltages VFD0 and VFD1 for the write operation of the data. Determination of the set voltages, the reset voltages and the verification voltages will be further described later.

A read operation for detecting the ON or OFF state of the memory cell may be performed using a read voltage VRD centered between the two resistance distributions. As illustrated in FIG. 12, read margin RMc of the read operation of the ECC code is greater than read margin RMd of the read operation of the data, since the resistance distributions of the code cells are more peaked than the resistance distributions of the data cells. Accordingly, the read operation of the ECC code may be performed more precisely than the read operation of the data even though the read voltage VRD is varied due to noises.

Figure 13:
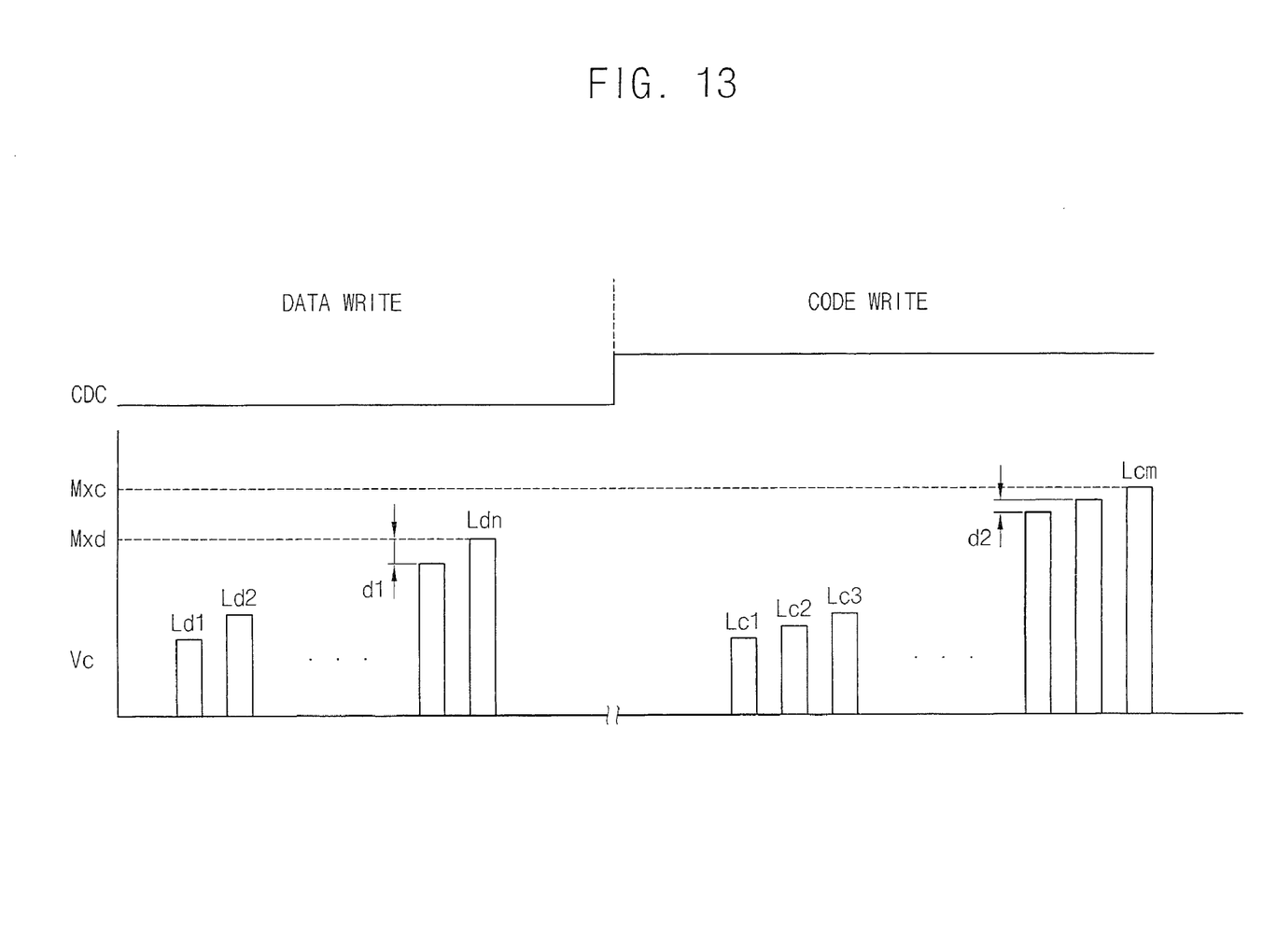
FIG. 13 is a diagram illustrating incremental step pulses for a write operation in a resistive memory device according to example embodiments.

FIG. 13 is a diagram illustrating incremental step pulses for a write operation in a resistive memory device according to example embodiments.

Referring to FIG. 13, logic low level of the mode signal CDC may indicate a write operation of data, and logic high level of the mode signal CDC may indicate a write operation of the ECC code. The voltage generate 600 of FIG. 5 may adjust, in respond to the mode signal CDC, at least one of the number, the voltage interval and the maximum voltage level of incremental step pulses (ISP) applied to memory cells for the write operation.

The voltage generator 600 generates first incremental step pulses Ld1 through Ldn in case of the write operation of the data, and second incremental step pulses Lc1 through Lcm in case of the write operation of the ECC code. The number (m) of the second incremental step pulses may be greater than the number (n) of the first incremental step pulses, for more precise write operation for the ECC code than the data.

In some embodiments, an interval d2 of voltage levels of the second incremental step pulses may be smaller than an interval d1 of voltage levels of the first incremental step pulses, for more precise write operation for the ECC code than the data. In other embodiments, a maximum voltage level Mxc of the second incremental step pulses may be greater than a maximum voltage level Mxd of the first incremental step pulses, for more precise write operation for the ECC code than the data.

The incremental step pulses in FIG. 13 may represent a voltage difference Vc applied between both ends of the memory cell during the write operation. The voltage generator 600 may provide at least one of the bias voltage VB of FIG. 10, the positive set voltage VP and the negative reset voltage VN of FIG. 11, with incremental step pulses, so that the voltage difference Vc as illustrated in FIG. 13 may be applied between both ends of the memory cell to be programmed. In some embodiments, the voltage applied to the common source line CSLi of FIG. 11 may be provided using incremental step pulses.

Figure 14:
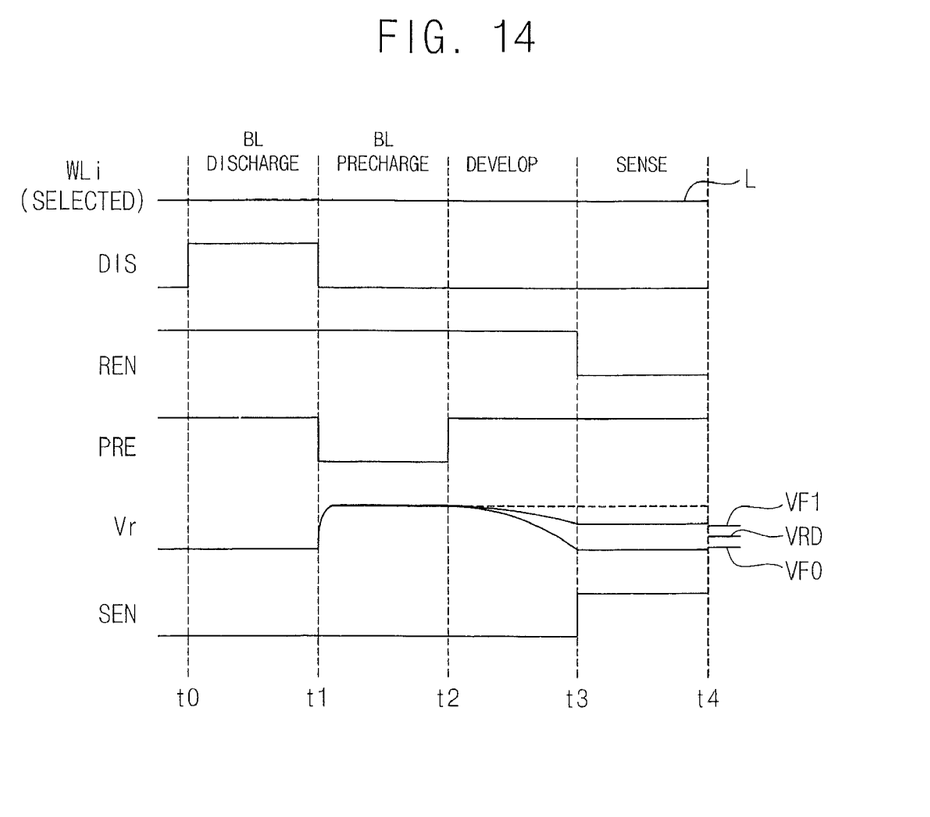
FIG. 14 is a timing diagram illustrating a verification operation in a resistive memory device according to example embodiments.

FIG. 14 is a timing diagram illustrating a verification operation in a resistive memory device according to example embodiments.

During the write operation, after one step pulse of FIG. 13 is applied to the memory cell, a verification operation similar to the read operation is performed using the verification voltage for verifying whether desired state has been programmed. When it is verified that programming has been completed, applying step pulses of higher voltage levels is intercepted to prevent excessive stress to the memory cells.

Referring to FIGS. 10 and 14, the selected wordline WLi is initialized to logic low level "L" (e.g., a level of a ground voltage) in advance. When the discharge signal DIS is activated to logic high level during discharge period t0 through t1, the third transistor T53 of the sense amplifier 350 is turned on and thus the bitline BLi is initialized to a ground voltage. When the precharge signal PRE is activated to logic low level during precharge period t1 though t2, the second transistor T52 is turned on the bitline BLi is charged with the precharge voltage VPRE.

When the precharge signal PRE is deactivated to logic high level at time t2, the precharge voltage VPRE is intercepted and the voltage of the bitline BLi decreases during develop period t2 through t3 since the bitline BLi is electrically connected through the memory cell MCi to the initialized wordline WLi. As illustrated in FIG. 14, the bitline voltage decreases slowly if the bitline BLi is coupled to a memory cell in the OFF-state of relatively high resistance, but the bitline voltage decreases rapidly if the bitline BLi is coupled to a memory cell in the ON-state of relatively low resistance.

When the sense enable signal SEN is activated to logic high level during sense period t3 through t4, the read enable signal REN is deactivated to logic low level to disconnect the bitline BLi from the sense amplifier 350. The comparator 352 receives the sensed voltage Vr after t3 as one input and the reference voltage VREF as the other input. The reference voltage VREF may be a set-verification voltage VF0 or a reset-verification voltage VF1 according to the set-write operation or the reset-write operation. The comparator 352 compares the sensed voltage Vr with the reference voltage VREF to generate the pass/fail signal P/F indicating whether the write operation is completed.

Figure 15:
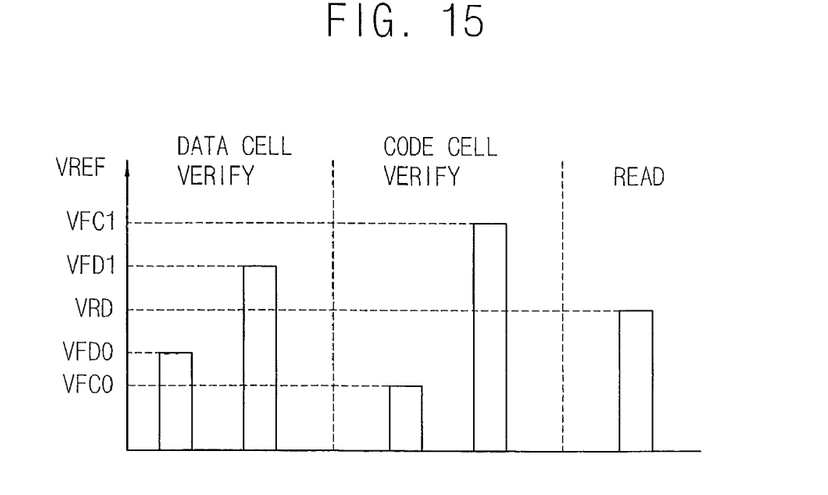
FIG. 15 is a diagram illustrating a verification voltage and a read voltage in a resistive memory device according to example embodiments.

FIG. 15 is a diagram illustrating a verification voltage and a read voltage in a resistive memory device according to example embodiments.

Referring to FIG. 15, a resistance distribution of code cells for storing the ECC code may be reduced more narrowly than a resistance distribution of data cells for storing the data, by controlling verification voltages.

For example, during a set-write operation for decreasing resistances of the data cells and the code cells, the verification voltages may be determined such that a set verification voltage VFC0 for the write operation of the ECC code is smaller than a set verification voltage VFD0 for the write operation of the data. The examples of the set verification voltages VFC0 and VFD0 and corresponding resistance distributions of ON-states of the code cells and the data cells are illustrated in FIG. 12. In contrast, during a reset-write operation for increasing the resistances of the data cells and the code cells, the verification voltages may be determined such that a reset verification voltage VFC1 for the write operation of the ECC code is greater than a reset verification voltage VFD1 for the write operation of the data. The examples of the reset verification voltages VFC1 and VFD1 and corresponding resistance distributions of OFF-states of the code cells and the data cells are illustrated in FIG. 12.

The read margin RMc of the read operation of the ECC code may be greater than the read margin RMd of the read operation of the data by determining the verification voltages as described above, and thus the read operation using the read voltage VRD may be performed with respect to the ECC code more reliably than with respect to the data.

As mentioned above, determining the conditions of the input-output operation may be performed by determining a condition of the write operation of the ECC code stricter than a condition of the write operation of the data. In addition, as will be described hereinafter, determining the conditions of the input-output operation may be performed by determining a condition of the read operation of the ECC code stricter than a condition of the read operation of the data.

Figure 16:
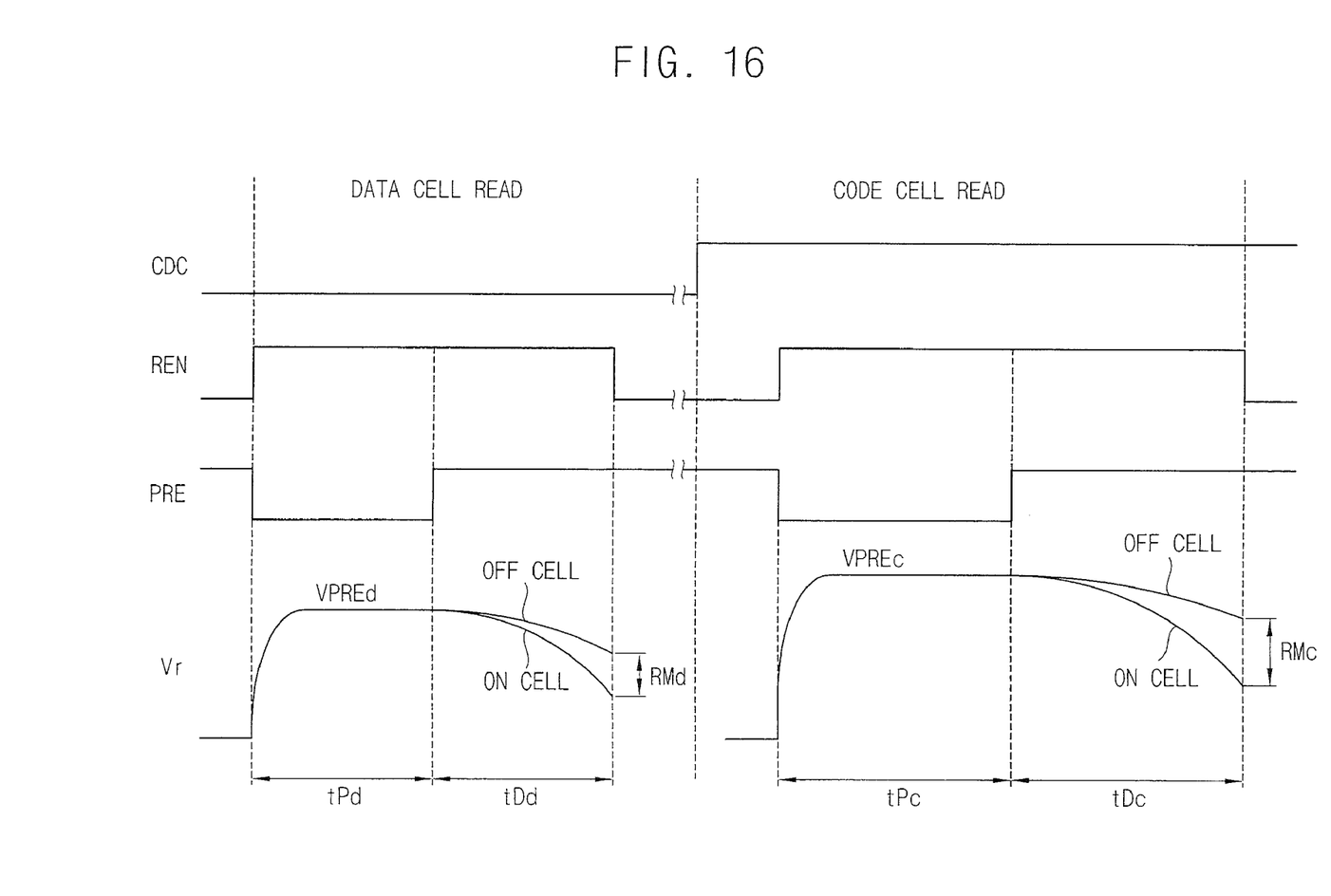
FIG. 16 is a timing diagram illustrating a read operation in a resistive memory device according to example embodiments.

FIG. 16 is a timing diagram illustrating a read operation in a resistive memory device according to example embodiments.

Referring to FIG. 16, logic low level of the mode signal CDC may indicate a read operation of data, and logic high level of the mode signal CDC may indicate a read operation of the ECC code.

In some embodiments, a bitline precharge time tPc for the read operation of the ECC code may be determined greater than a bitline precharge time tPd for the read operation of the data. Accordingly the time for the bitline to be charged with the precharge voltage may be secured sufficiently in case of reading the ECC code. The control circuit 500 of FIG. 5 generates the precharge signal PRE in response to the mode signal CDC, such that the activation time period (that is, the bitline precharge time tPc or tPd) of the precharge signal PRE is longer for the read operation of the ECC code than for the read operation of the data.

In some embodiments, a develop time tDc for the read operation of the ECC code may be determined greater than a develop time tDd for the read operation of the data. Accordingly the time for the bitline voltage to be dropped as described with reference FIG. 14 may be secured sufficiently in case of reading the ECC code. By increasing the difference between the sensed voltage Vr of the ON-cell and the sensed voltage Vr of the OFF-cell, the read margin RMc of the read operation of the ECC code may be greater than the read margin RMd of the read operation of the data. The control circuit 500 of FIG. 5 may control deactivation timing of the read enable signal REN in response to the mode signal CDC, such that the develop time tDc for the read operation of the ECC code is greater than the develop time tDd for the read operation of the data.

In some embodiment, a precharge voltage VPREc for the read operation of the ECC code may be determined greater than a precharge voltage VPREd for the read operation of the data. Accordingly the difference between the sensed voltage Vr of the ON-cell and the sensed voltage Vr of the OFF-cell may be increased in case of the ECC code compared with the case of the data. The voltage generator 600 of FIG. 5 may control the precharge voltage in response to the voltage control signal from the control circuit, such that the precharge voltage VPREc for the read operation of the ECC code is greater than the precharge voltage VPREd for the read operation of the data.

As mentioned above, in resistive memory devices and methods of controlling resistive memory devices according to example embodiments, reliability of the input-output operation of the ECC code may be enhanced, thereby reducing errors due to defect memory cells, noise etc. The example embodiments may be applied to resistive memory devices having ECC function and memory systems including the memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile integrated circuit memory device having variable-resistance nonvolatile memory cells therein, comprising:
    generating a first ECC code associated with first data;
    writing the first data into the memory device using data write operations; and
    writing the first ECC code into the memory device using ECC write operations configured to be more stringent in maintaining a stored accuracy of the first ECC code in the memory device relative to a stored accuracy of the first data in the memory device, said ECC write operations further configured to provide a narrower resistance distribution of a first data value written into the memory device relative to a resistance distribution of the first data value written into the memory device using the data write operations.

2. The method of claim 1, further comprising:
    reading the first ECC code and the first data from the memory device; and
    correcting an error in the first data using the first ECC code to identify a presence of the error in the first data.

3. The method of claim 1, wherein incremental step pulses associated with the ECC write operations are smaller in magnitude relative to incremental step pulses associated with the data write operations.

4. The method of claim 3, wherein a maximum voltage generated by the incremental step pulses associated with the ECC write operations is greater than a maximum voltage generated by the incremental step pulses associated with the data write operations.

5. The method of claim 1, wherein the memory device comprises a plurality of pages of memory cells therein; wherein said writing the first data comprises writing the first data into a first page of memory cells in the memory device;

and wherein said writing the first ECC code comprises writing the first ECC code into a second page of memory cells in the memory device.

6. The method of claim 1, further comprising:
reading the first data from the memory device using data read operations; and
reading the first ECC code from the memory device using ECC read operations that are configured to be more stringent in maintaining an accuracy of the first ECC code being read from the memory device relative to an accuracy of the first data being read from the memory device.

7. The method of claim 6, wherein the nonvolatile integrated circuit memory device is selected from a group consisting of EEPROM memory devices, resistive memory devices, magnetic memory devices and phase-changeable memory devices.

8. A nonvolatile integrated circuit memory device, comprising:
an array of non-volatile memory cells; and
a control circuit electrically coupled to said array of non-volatile memory cells, said control circuit configured to write first data into the memory device using data write operations and further configured to write a first ECC code associated with the first data into the memory device using ECC write operations that are configured to be more stringent in maintaining a stored accuracy of the first ECC code in the memory device relative to a stored accuracy of the first data in the memory device by reducing a resistance distribution within non-volatile memory cells that store the first ECC code more narrowly relative to a resistance distribution of non-volatile memory cells that store the first data.

9. The memory device of claim 8, wherein said control circuit is further configured to:
read the first data from the memory device using data read operations; and
read the first ECC code from the memory device using ECC read operations that are configured to be more stringent in maintaining an accuracy of the first ECC code being read from the memory device relative to an accuracy of the first data being read from the memory device.

10. A method of controlling operations of a resistive memory device, comprising
separating an input-output operation of an error check and correction (ECC) code from an input-output operation of data; and
determining a condition of the input-output operation of the ECC code stricter than a condition of the input-output operation of the data by reducing a resistance distribution of code cells for storing the ECC code more narrowly than a resistance distribution of data cells for storing the data.

11. The method of claim 10, wherein the input-output operations of the ECC code and the data are separated based on a mode signal or an address signal provided from an external device.

12. The method of claim 10, wherein separating the input-output operations of the ECC code and the data includes:
separating a write operation of the ECC code from a write operation of the data.

13. The method of claim 10, wherein reducing the resistance distribution of the code cells includes:
generating first incremental step pulses for the write operation of the data; and
generating second incremental step pulses for the write operation of the ECC code, a number of the second incremental step pulses being greater than a number of the first incremental step pulses.

14. The method of claim 13, wherein an interval of voltage levels of the second incremental step pulses is smaller than an interval of voltage levels of the first incremental step pulses.

15. The method of claim 13, wherein a maximum voltage level of the second incremental step pulses is greater than a maximum voltage level of the first incremental step pulses.

16. The method of claim 10, wherein reducing the resistance distribution of the code cells includes:
determining a set verification voltage for the write operation of the ECC code smaller than a set verification voltage for the write operation of the data, during a set-write operation for decreasing resistances of the data cells and the code cells; and
determining a reset verification voltage for the write operation of the ECC code greater than a reset verification voltage for the write operation of the data, during a reset-write operation for increasing the resistances of the data cells and the code cells.

17. The method of claim 10, wherein separating the input-output operations of the ECC code and the data includes:
separating a read operation of the ECC code from a read operation of the data.

18. A method of controlling operations of a resistive memory device, comprising:
separating a read operation of an error check and correction (ECC) code from a read operation of data; and
determining a condition of the read operation of the ECC code stricter than a condition of the input-output operation of the data;
wherein determining the conditions of the read operations of the ECC code and the data includes at least one of:
determining a bitline precharge time for the read operation of the ECC code greater than a bitline precharge time for the read operation of the data;
determining a develop time for the read operation of the ECC code greater than a develop time for the read operation of the data; and
determining a precharge voltage for the read operation of the ECC code greater than a precharge voltage for the read operation of the data.

* * * * *